(12) United States Patent
Wilk et al.

(10) Patent No.: US 6,245,606 B1
(45) Date of Patent: Jun. 12, 2001

(54) LOW TEMPERATURE METHOD FOR FORMING A THIN, UNIFORM LAYER OF ALUMINUM OXIDE

(75) Inventors: Glen D. Wilk, Dallas; Robert M. Wallace, Richardson, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/421,815

(22) Filed: Oct. 20, 1999

Related U.S. Application Data
(60) Provisional application No. 60/108,764, filed on Nov. 17, 1998.

(51) Int. Cl.[7] ............................................... H01L 21/8238
(52) U.S. Cl. ......................... 438/216; 438/591; 438/287; 257/324; 257/406
(58) Field of Search .................... 438/216, 287, 438/591; 257/324, 406

(56) References Cited

U.S. PATENT DOCUMENTS

| | | | | |
|---|---|---|---|---|
| 3,766,637 | * | 10/1973 | Norris et al. | 438/216 |
| 4,566,173 | * | 1/1986 | Gossler et al. | 438/216 |
| 4,791,071 | * | 12/1988 | Ang | 438/216 |
| 5,872,031 | * | 2/1999 | Mishra et al. | 438/216 |
| 6,100,120 | * | 8/2000 | Yu | 438/151 |

OTHER PUBLICATIONS

Application No. 08/904,009 filed Jul. 31, 1997.
Application No. 09/176,422 filed Oct. 21, 1998.
Application No. 09/396,642 filed Sep. 15, 1999.

* cited by examiner

*Primary Examiner*—Charles Bowers
*Assistant Examiner*—David S Blum
(74) *Attorney, Agent, or Firm*—David Denker; Wade James Brady, III; Frederick J. Telecky, Jr.

(57) ABSTRACT

This invention pertains generally to forming thin aluminum oxides at low temperatures, and more particularly to forming uniformly thick, aluminum gate oxides. We disclose a low temperature method for forming a thin, uniform aluminum gate oxide 16 on a silicon surface 12. This method includes providing a partially completed integrated circuit on a semiconductor substrate 10 with a clean, hydrogen terminated or atomically flat, silicon surface 12; forming a uniformly thick aluminum layer 13; and stabilizing the substrate at a first temperature. The method further includes exposing the aluminum layer to an atmosphere 14 including ozone, while maintaining the substrate 10 at the first temperature. In this method, the exposing step creates a uniformly thick, aluminum oxide film 16. This method is suitable for room temperature processing.

20 Claims, 2 Drawing Sheets

US 6,245,606 B1

LOW TEMPERATURE METHOD FOR FORMING A THIN, UNIFORM LAYER OF ALUMINUM OXIDE

CROSS-REFERENCE TO RELATED APPLICATIONS

This application claims priority from Provisional Application No. 60/108,764 filed Nov. 17, 1998.

The following co-assigned U.S. patent applications are hereby incorporated by reference:

| Filing Date | Appl. # | Title |
| --- | --- | --- |
| 7/31/97 | 08/904,009 | Method For Thin Film Deposition On Single-Crystal Semiconductor Substrates |

FIELD OF THE INVENTION

This invention pertains generally to forming aluminum oxide dielectrics at low temperatures, and more particularly to forming aluminum gate oxide layers with high thickness uniformity.

BACKGROUND OF THE INVENTION

Semiconductors are widely used in integrated circuits for electronic devices such as computers and televisions. These integrated circuits typically combine many transistors on a single crystal silicon chip to perform complex functions and store data. Semiconductor and electronics manufacturers, as well as end users, desire integrated circuits that can accomplish more functions in less time in a smaller package while consuming less power. Miniaturization is a common approach to help meet these goals.

With increasing miniaturization, one concern is the thickness of the gate dielectric used in conventional CMOS circuits. The current drive in a CMOS transistor is directly proportional to the gate capacitance. Since capacitance scales inversely with gate dielectric thickness, higher current drive requires continual reductions in thickness for conventional dielectrics. Present technology uses silicon dioxide ($SiO_2$) based films with thicknesses near 5 nm. However, projections suggest the need for 2 nm (20 Å) films for future small geometry devices.

SUMMARY OF THE INVENTION

Pure $SiO_2$ gate dielectrics will not be scaleable below 2 nm because of reliability problems (premature breakdown) and high leakage. This lack of scaleability motivates the search for higher dielectric constant materials. Generally, the search has centered on materials with $\epsilon > 20$–50, thus providing significant margin. However, we believe that even moderate dielectric constant materials ($\epsilon=10$) can provide useful gate dielectrics, if a suitable manufacturing method is developed. $Al_2O_3$'s thermodynamic stability on Si and moderate dielectric constant ($\epsilon=10$) makes it a potential choice for a gate dielectric. We believe this usefulness may exist even though many artisans have avoided aluminum contact with Si, due to the potential of spiking.

The current method typically used for forming $Al_2O_3$ is sputtering pure Al in an $AR/O_2$ ambient. This sputter deposition method of Al in an $O_2$ ambient tends to oxidize the Si substrate at onset of deposition, forming an undesirable $SiO_2$ layer. It is also difficult to reproducibly deposit ~30–60 angstroms this way.

Sputter deposition, rapid thermal oxidation and furnace annealing are three current methods for forming aluminum oxide gate dielectrics. However, current methods do not reliably produce gate oxides with the thickness uniformity and interface smoothness that will be needed to make devices with approximately 2–4 nm gate oxides practical. Additionally, these methods add significantly to the wafer's thermal budget.

We disclose a low temperature method for forming a thin aluminum oxide gate dielectric on a silicon surface, the method includes providing a partially completed integrated circuit on a semiconductor substrate with a clean silicon surface; determining a first planned temperature—no greater than about 300 degrees C.—for an aluminum oxide film formation; thereby substantially determining a potential thickness of oxidizable aluminum. The method further includes forming a uniformly thick layer of aluminum on the silicon surface to form a temporary aluminum layer, the temporary aluminum layer having a thickness no greater than the potential thickness of oxidizable aluminum; stabilizing the substrate at the first planned temperature; and exposing the temporary aluminum layer to an atmosphere including ozone, while maintaining the substrate at the first planned temperature. In this method, the exposing step creates a first, uniformly thick, aluminum gate oxide film. The method also typically includes forming a gate electrode on the aluminum gate oxide film.

In some embodiments, exposing the aluminum layer to an atmosphere including ozone uses a commercial ozone generator, while others include exposing the aluminum layer to an atmosphere including molecular oxygen, while irradiating at least a portion of the atmosphere with an ultraviolet light, where the light transforms some of the oxygen to ozone. In some embodiments, the atmosphere further includes an inert gas, such as argon. Preferably, the ozone at the aluminum layer is not in an excited energy state, such as a plasma. However, a plasma kept away from the wafer may be acceptable.

In some embodiments, the clean silicon surface is atomically flat. Typically, the semiconductor substrate contains some areas that already have some structure, such as a field oxide. In some embodiments, the substrate has a plurality of clean, atomically flat, silicon surfaces. This might occur when the gate oxide is applied to surfaces exposed by etching "windows" in a layer overlying a silicon surface; or when overlying layers are added to the silicon surface, except where "islands" have been masked off.

In some embodiments, the first planned temperature is about 25 degrees C. and the aluminum gate oxide film has a thickness of about 10 angstroms. In other embodiments, the first temperature may be up to about 300 degrees C., or even up to 530 degrees C. These temperatures will grow thicker oxides (up to about 50 angstroms) as shown in FIG. 3.

In another aspect of this method, the method further includes depositing a uniformly thick layer of aluminum on the first aluminum oxide film to form a temporary aluminum layer, the temporary aluminum layer having a thickness no greater than the potential thickness of oxidizable aluminum. This potential thickness is found by determining a second planned substrate temperature for a second oxide film formation, the planned temperature no greater than about 300 degrees C.—often the same as the first planned temperature. This planned temperature substantially determines the potential thickness of oxidizable aluminum. After depositing the aluminum, the method further includes exposing the temporary aluminum layer to a second atmosphere containing ozone, while the substrate is at the planned substrate temperature. This exposing step oxidizes the temporary aluminum layer to form a second, uniformly thick, aluminum oxide film extending to the first oxide film; thereby creating a single (combined), uniformly thick, aluminum oxide film.

In some embodiments, the method further includes stabilizing the substrate at the second planned substrate temperature before the exposing step.

DETAILED DESCRIPTION

Figure 1A:
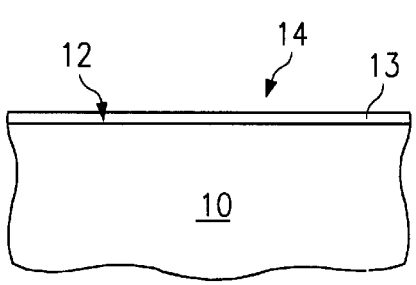
FIGS. 1A–1C show a low temperature method for forming a very thin, uniform aluminum oxide layer.
Figure 1B:
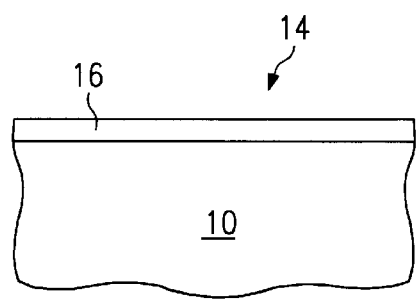
Figure 1C:
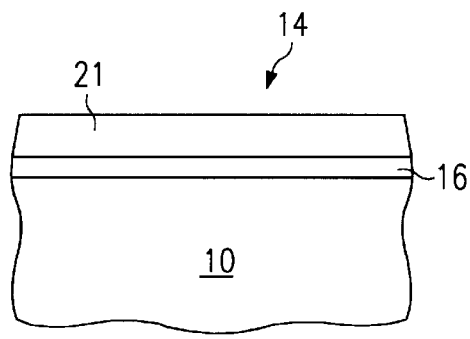
Figure 2A:
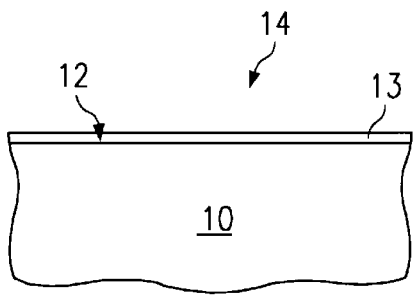
FIGS. 2A–2D show a low temperature method for forming a very thin, uniform aluminum oxide layer.
Figure 2B:
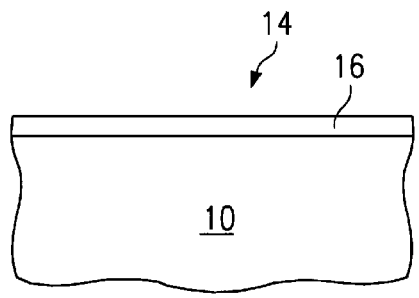
Figure 2C:
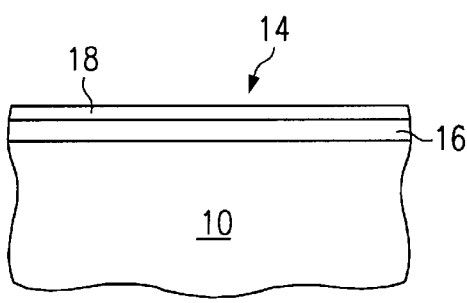
Figure 2D:
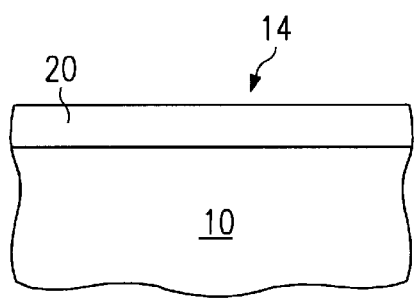

FIG. 1 outlines a method of using this invention to form a very thin, uniform $Al_2O_3$ gate dielectric on a silicon substrate. Initially, Si substrate 10 with a clean surface 12 is provided. Typically, this substrate 10 will include a partially completed integrated circuit with part of the surface 12 being either bare or hydrogen passivated silicon. This surface 12 may already have structures, such as field oxide regions, already formed upon it, and other structures, such as diffusion regions formed in the substrate beneath it.

We have found that a smooth, flat silicon surface tends to grow a more uniform oxide (particularly for very thin oxides) with this method. Thus, although a hydrogen terminated silicon surface usually produces acceptable results, some very thin, highly uniform aluminum oxide gate dielectrics prefer a silicon underlayer that approaches an atomically flat or atomically stepped surface. For our purposes, an atomically stepped surface will have a very low rms surface roughness, comparable to an atomically flat surface, in most areas. A wafer with an atomically stepped surface may have a series of adjacent flat surfaces (terraces). These terraces typically do not extend across a substrate wafer, and are not required to extend across a single device on a wafer. With very thin gate dielectrics, we sometimes prefer that adjacent terraces be connected by well-defined single- or double-atomic-height steps.

Figure 3:
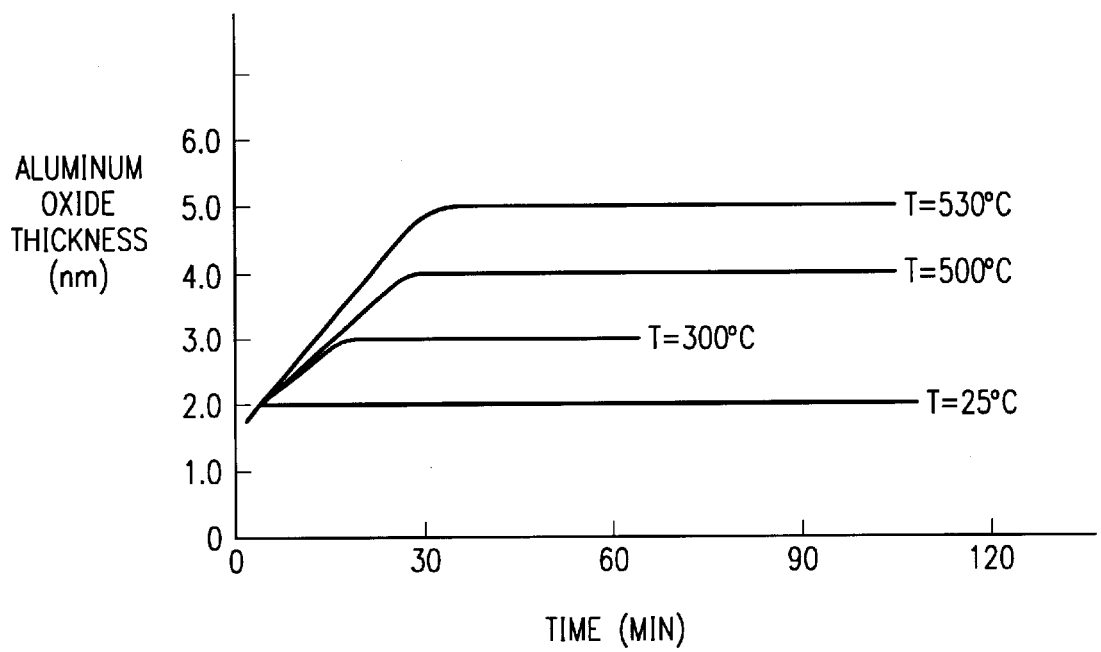
FIG. 3 shows a relationship between time, aluminum oxide thickness, and temperature.

In our ozone-based method, the oxidation thickness substantially depends upon the oxidation temperature. Thus, for a given processing set-up, the planned oxidation temperature determines the potential thickness of oxidizable aluminum. Thus, before continuing, the planned oxidation temperature must be determined. This oxidation temperature substantially depends upon the thickness of the ozone-base aluminum oxide desired as shown in FIG. 3. This figure shows that for 2.0 nm aluminum oxides, the temperature should be near 25 degrees C. For a 3.0 nm aluminum oxide, the temperature should be approximately 300 degrees C. Similarly, 500 to 530 degrees C. forms an approximately 4.0–5.0 nm oxide, high quality aluminum oxide. These low temperature formations are important, due to the low melting point of aluminum.

FIG. 3 was generated for UV-generated ozone in substantially pure oxygen at a 400 Torr $O_2$ pressure. Other ozone generation methods, or different oxygen pressures and/or concentrations may require adjustment of the temperature to yield a desired, precise aluminum oxide thicknesses.

It is desirable to end up with a fully oxidized aluminum layer, without substantial oxidation of the underlying silicon. But ozone is an excellent oxidizer for silicon, thus process control considerations require that we accept a small amount of unoxidized aluminum or oxidized silicon. In a gate dielectric application, it is more preferable to oxidize a small part of the silicon, than to leave unoxidized aluminum. If significant unoxidized Al remains, the metal layer can terminate the electric field in the $Al_2O_3$, not allowing channel inversion.

Upon the silicon substrate 10, we first form a thin, uniform layer of aluminum 13. Since an unoxidized layer of aluminum grows thicker upon oxidation, skilled artisans know to make the aluminum layer 13 thinner than the potential thickness of oxidized aluminum. Typically, this aluminum layer 13 will be formed by sputtering or by atomic layer epitaxy. However, the method is not important as long as the thickness, composition, and uniformity are well controlled.

After the aluminum layer 13 is formed, but before exposure to an oxygen source, the substrate 10 (along with aluminum 13) temperature is stabilized at the planned oxidation temperature determined above.

This ability to grow precise, repeatable, usefully thick aluminum oxides at low temperatures greatly simplifies the temperature control problems. The ability to stabilize the whole wafer at the oxidation temperature allows for excellent process control, thus giving a uniform, repeatable oxidation thickness. Useful thermal oxides can be grown on wafers sitting in easily controlled furnaces. We have also found that this method is capable of producing aluminum oxides with good electrical properties. This ozone-based method can routinely achieve breakdown voltages above 10 MV/cm.

The clean, temperature stabilized wafer with aluminum layer 13 is exposed to ozone 14. We have found that introducing molecular oxygen to the reaction chamber and exposing the oxygen to a mercury lamp (particular with 183 nm and 253 nm emission lines), generates sufficient quantities of ozone. Other ultraviolet sources or other non-energetic ozone sources can be substituted for the mercury lamp generated ozone, and can be placed remotely from wafer. These other sources include commercial ozone generators. As an example, barrier discharge ozonizers are available as clean room compatible ozone generators. Energetic ozone sources can be used, but it is preferable to keep any excited ozone species from contacting the wafer. We have found that methods that allow an ozone plasma to contact the wafer form aluminum oxides with poor electrical properties, such as a significantly lower breakdown voltage. The ozone plasma methods also tend to exhibit poor uniformity and have repeatability problems. In our non-plasma ozone-based method, the oxygen/ozone 14 pressure can be varied from below a microtorr to several atmospheres. We have found that pressures between several hundred torr and one atmosphere provide a simple method to provide good results. If desired, the oxygen/ozone 14 can be mixed with an inert gas, such as argon.

This ozone-based process forms a very uniform, substantially thick aluminum oxide layer 16 on the exposed silicon surface 12. This oxide layer 16 is much thicker than a conventional thermal oxide formed from exposing aluminum to $O_2$ at the same temperature and time. Of even more importance, this oxide 16 is very repeatable and very uniform, primarily due to its self-limiting nature. This repeatability allows for very small thicknesses of underlying $SiO_2$. When depositing a thick aluminum layer on a substantially flat silicon surface, this method repeatably produces $Al_2O_3$ layers with thickness uniformities better than 3% (better than 0.1 nm uniformity of an 3.0 nm thick oxide) across a 4 inch test wafer. Better heating uniformity can allow thickness uniformities below 1%. In fact, this method's oxide thickness uniformity will likely be limited in practice only by the aluminum layer thickness or the process heating uniformity, as opposed to the oxidation method itself. A typical transistor or capacitor layout will include a gate (or capacitor) electrode 21 superadjacent to the oxide 16.

FIG. 3 shows that this method has a very slight time dependent component. However, for most temperature/thickness combinations, the oxidation rate has already slowed dramatically after 30 to 60 minutes. Thus, this process is nearly self terminating with reasonable reaction times. As such, this method can be relatively insensitive to large variations in oxidation time.

As the chart shows, higher temperatures will produce thicker oxides with this method. We have found that, if the thermal budget allows, we can easily produce high quality, 4–5 nm thermal oxides at only 500° C. Sometimes an artisan may prefer to use lower temperatures, but grow substantially thicker layers than shown in FIG. 3. For this case, we add extra steps as shown in FIG. 2, but still obtain a highly uniform oxide.

This variation involves first forming a highly uniform aluminum oxide layer 16 on a silicon surface 12 as described above. Next, another aluminum layer 18 is deposited on the aluminum oxide layer 16. The thickness and uniformity of the final oxide layer will depend upon the thickness of the aluminum layer 18. Thus, like above, aluminum layer 18 should be formed with a well-controlled method, such as sputter deposition or atomic layer epitaxy. This new aluminum surface is then exposed to another ozone/oxygen atmosphere 14, forming a single $Al_2O_3$ layer 20. In this step, the total thickness of aluminum oxide layer 20 is determined by the thickness of the aluminum 18 and the underlying aluminum oxide layer 16. However, the ozone allows complete oxidation of much thicker aluminum layers than a straight oxygen atmosphere. If necessary, this aluminum deposition and oxidation can be repeated to form thicker layers.

Figure 4:
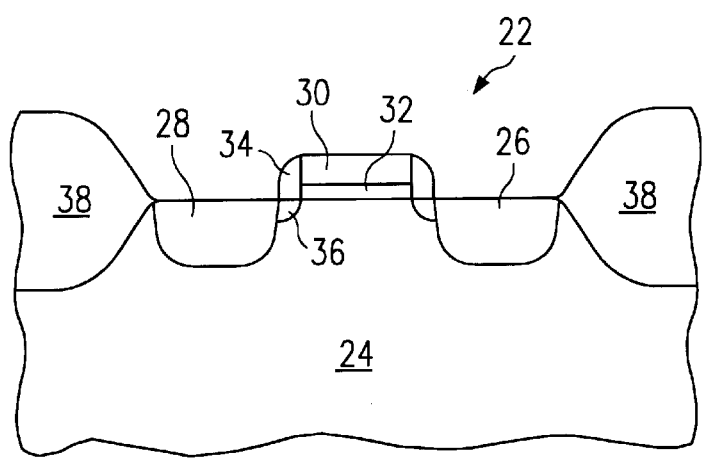
FIG. 4 shows a field-effect transistor using a thin, uniform aluminum oxide layer as the gate dielectric.

FIG. 4 shows a metal-oxide-silicon field-effect transistor (MOSFET) embodiment of this invention. Field-effect transistor 22 has four principal parts: a substrate 24, a source 26, a drain 28, and a gate, where the gate includes the gate electrode 30 and thin aluminum oxide gate dielectric 32. For an NMOS transistor 22, p-type silicon substrate 24 includes n+ source 26 and n+drain 28 regions. Gate dielectric 32 is a very thin, very uniform, aluminum oxide film, formed by using ozone to oxidize an aluminum layer on clean silicon substrate 24. MOSFET transistor 22 also includes sidewall spacers 34, lightly doped drain (LDD) region 36, and isolation region 38. Those skilled in the art will recognize that these and other features may be used or left out, depending upon the particular function of the device and the intended processing flow.

These examples have shown NMOS transistors. Since the ozone-based thin aluminum gate oxide method is substantially insensitive to the doping profile of Si, no special modifications are required to implement this invention in PMOS devices or CMOS devices; or into $Al_2O_3$ based capacitors, which require a thin, very uniform dielectric with low electrical leakage and a high breakdown voltage.

Although this method provides substantial benefits when used to form thin oxide layers, it can also offer an improvement over typical methods for forming thicker high-quality oxide layers, such as a dielectric around the floating gate in a flash memory cell. If the thermal budget permits, this ozone-based method can be used to form relatively thick $Al_2O_3$ layers in a single pass, or even thicker layers in a layered approach like that described above. Although these thicker layers may require temperatures above 500 degrees C., this variation of the ozone-based method allows lower temperature processing than conventional oxidation processes. Not only do these lower temperatures help the thermal budget, but the self-limiting nature of a ozone-based process improves process repeatability and oxide thickness uniformity, without sacrificing the oxide's electrical quality.

The present invention has been described with several sample embodiments. However, various changes and modifications may be suggested to one skilled in the art. It is intended that the present invention encompass such changes and modifications as fall within the scope of the appended claims.

We claim:

1. A low temperature method for forming a thin gate dielectric on a silicon surface, the method comprising:
   providing a partially completed integrated circuit on a semiconductor substrate with a clean, atomically flat, silicon surface:
   providing a first temperature for an aluminum oxide film formation, the first temperature no greater than about 300 degrees C.; thereby substantially determining a potential thickness of oxidizable aluminum;
   forming a uniformly thick layer of aluminum on the silicon surface to form a temporary aluminum layer, the temporary aluminum layer having a thickness no greater than the potential thickness of oxidizable aluminum.
   stabilizing the substrate at the first temperature;
   exposing the temporary aluminum layer to an atmosphere including ozone, while maintaining the substrate at the first temperature, wherein the exposing step creates a first, uniformly thick, aluminum gate oxide film.

2. The method of claim 1, wherein exposing the aluminum layer to an atmosphere including ozone comprises:
   exposing the aluminum layer to an atmosphere including molecular oxygen, while irradiating at least a portion of the atmosphere with an ultraviolet light, the light operative to transform some of the oxygen to ozone.

3. The method of claim 1, wherein the atmosphere further comprises an inert gas.

4. The method of claim 1, wherein exposing the aluminum layer to an atmosphere including ozone includes exposing the aluminum layer to an atmosphere with less energy than a plasma.

5. The method of claim 4, wherein at least part of the atmosphere that does not contact the aluminum layer includes an ozone plasma.

6. The method of claim 1, wherein the semiconductor substrate includes a plurality of clean, atomically flat, silicon surfaces.

7. The method of claim 1, further comprising forming a gate electrode on the aluminum gate oxide film.

8. The method claim 1, wherein the fist temperature is about 25 degrees C. and the aluminum gate oxide film has a thickness of about 10 angstroms.

9. The method of claim 1, wherein the first temperature is between 0 and 300 degrees C. and the aluminum gate oxide film has a thickness between 5 and 30 angstroms.

10. The method of claim 1, wherein the first temperature is about 300 degrees C.

11. The method of claim 1, wherein the first temperature is about 300 degrees C. and the aluminum gate oxide film has a thickness of about 30 angstroms.

12. The method of claim 1, further comprising:

providing a second temperature for a second aluminum oxide film formation, the second temperature no greater than about 300 degrees C.; thereby substantially determining a second potential thickness of oxidizable aluminum;

depositing a uniformly thick layer of aluminum on the first aluminum gate oxide film to form a second temporary aluminum layer, the second temporary aluminum layer having a thickness no greater than the second potential thickness of oxidizable aluminum;

exposing the second temporary aluminum layer to a second atmosphere including ozone, while the substrate is at the second temperature, wherein the exposing step oxidizes the second temporary aluminum layer to form a second, uniformly thick, oxide film extending to the first oxide film; thereby creating a combined, uniformly thick, aluminum gate oxide film.

13. The method of claim 12, further comprising:

stabilizing the substrate at the second temperature before the exposing step.

14. The method of claim 12, further comprising:

repeating the depositing, and exposing to an atmosphere including ozone steps at least once; thereby increasing the thickness of the combined aluminum gate oxide film.

15. The method of claim 12, wherein the first temperature and the second temperatures are about 25 degrees C. and the combined aluminum gate oxide film has a thickness of about 40 angstroms.

16. A low temperature method for forming a thin aluminum gate oxide on a silicon surface, the method comprising:

providing a partially completed integrated circuit on a semiconductor substrate with a clean silicon surface;

providing a first temperature for an aluminum oxide film formation, the first temperature no greater than about 300 degrees C.; thereby substantially determining a potential thickness of oxidizable aluminum;

forming a uniformly thick layer of aluminum on the silicon surface to form a temporary aluminum layer, the temporary aluminum layer having a thickness no greater than the potential thickness of oxidizable aluminum;

stabilizing the substrate at the first temperature;

exposing the temporary aluminum layer to an atmosphere including ozone, while maintaining the substrate at the first temperature, wherein the exposing step creates a first, uniformly thick, aluminum gate oxide film; and forming a gate electrode on the oxide film.

17. The method of claim 16, wherein the silicon surface is an atomically stepped surface.

18. The method of claim 16, further comprising:

providing a second temperature for a second oxide film formation, the second temperature no greater than about 300 degrees C.; thereby substantially determining a potential thickness of oxidizable silicon;

depositing a uniformly thick layer of silicon on the first oxide film to form a temporary silicon layer, the temporary silicon layer having a thickness no greater than the potential thickness of oxidizable silicon;

exposing the temporary silicon layer to a second atmosphere including ozone, while the substrate is at the second temperature, wherein the exposing step oxidizes the temporary silicon layer to form a second, uniformly thick, oxide film extending to the first oxide film, thereby creating a combined, uniformly thick, oxide film.

19. The method of claim 18, further comprising:

stabilizing the substrate at the second temperature before the exposing step.

20. The method of claim 18, further comprising:

repeating the depositing, and exposing to an atmosphere including ozone steps at least once; thereby increasing the thickness of the combined oxide film.

* * * * *